United States Patent
Miyatake et al.

(10) Patent No.: US 6,483,350 B2
(45) Date of Patent: *Nov. 19, 2002

(54) SENSE-AMPLIFYING CIRCUIT

(75) Inventors: Hisatada Miyatake, Ohtsu (JP); Yotaro Mori, Shiga-ken (JP); Masahiro Tanaka, Moriyama (JP)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/393,779

(22) Filed: Sep. 10, 1999

(65) Prior Publication Data

US 2001/0043087 A1 Nov. 22, 2001

(30) Foreign Application Priority Data

Sep. 11, 1998 (JP) .......................................... 10-258541

(51) Int. Cl.[7] .............................................. G01R 19/00
(52) U.S. Cl. .............................. 327/51; 327/52; 327/55
(58) Field of Search ............................. 327/51, 52, 54, 327/55, 57, 65, 67; 365/207, 208, 205; 330/252–253

(56) References Cited

U.S. PATENT DOCUMENTS

| 4,169,233 A | * | 9/1979 | Haraszti | 327/57 |
| 4,843,264 A | * | 6/1989 | Galbraith | 327/55 |
| 5,097,157 A | * | 3/1992 | Jaffe et al. | 327/55 |
| 5,355,391 A | * | 10/1994 | Horowitz et al. | 375/257 |
| 5,650,971 A | * | 7/1997 | Longway et al. | 365/207 |
| 5,726,942 A | * | 3/1998 | Yoneda et al. | 365/208 |
| 5,896,336 A | * | 4/1999 | McClure | 365/205 |
| 5,903,171 A | * | 5/1999 | Shieh | 327/55 |
| 5,963,495 A | * | 10/1999 | Kumar | 365/207 |
| 6,037,807 A | * | 3/2000 | Wu et al. | 327/52 |

FOREIGN PATENT DOCUMENTS

| JP | 06-60677 | 3/1994 |
| JP | 08-255495 | 10/1996 |
| JP | 10-27468 | 1/1998 |
| JP | 10-50071 | 2/1998 |
| JP | 10-106266 | 4/1998 |

OTHER PUBLICATIONS

PUPA11–176163.
PUPA2000–21180.

* cited by examiner

Primary Examiner—Matthew Smith
Assistant Examiner—Paul Dinh
(74) Attorney, Agent, or Firm—Anthony J. Canale; Robert A. Walsh

(57) ABSTRACT

A sense-amplifying circuit 10 which comprises a pair of inverters (TP0, TN0, TP1 and TN1), wherein an output of each inverter is connected to an input of the other inverter, drains of sensing transistors TN2 and TN3 are respectively connected to each source of the pair of inverters in series, the gates of both sensing transistors TN2 and TN3 are connected to differential input signal lines 12 and 14, and the sources of both sensing transistors TN2 and TN3 are connected through a common node with a transistor TN4, which works not only as a constant current source but also as an operation switch for the sense-amplifying circuit.

10 Claims, 7 Drawing Sheets

SENSE-AMPLIFYING CIRCUIT

FIELD OF THE INVENTION

The present invention relates to a sense-amplifying circuit for detecting and amplifying slight differential signals in a semiconductor circuit.

BACKGROUND

Conventionally, a circuit as shown in FIG. 6(a), FIG. 7(a) or FIG. 7(b) is used as a sense-amplifying circuit in a semiconductor device. In the drawings, TPn wherein n represents an integer of 0 or more and TNn wherein n represents an integer of 0 or more indicate a p-channel metal oxide semiconductor (hereinafter referred to as p-MOS) transistor and a n-channel metal oxide semiconductor (hereinafter referred to as a n-MOS) transistor, respectively. A sense-amplifying circuit 60 shown in FIG. 6(a) is an amplifier wherein two sense-amplifying circuits 90 using a current-mirror load shown in FIG. 6(b) is symmetrically arranged in parallel, and is widely used for a high-speed complementary metal oxide semiconductor—static random access memory (hereinafter referred to as CMOS-SRAM). Further, the sense-amplifying circuit 60 is experimentally used as a read amplifier of a dynamic random access memory (hereinafter referred to as DRAM). A sense-amplifying circuit 70 shown in FIG. 7(a) is an improved type of the sense-amplifying circuit 60 shown in FIG. 6(a), wherein gain is improved by adding p-MOS transistors QP1 to QP4 as active loads to said circuit 60. A sense-amplifying circuit 80 shown in FIG. 7(b) is generally used for amplifying bit line signals of a CMOS-DRAM, and can be used for a static random access memory (hereinafter referred to as SRAM).

In the sense-amplifying circuits 60 and 70 of FIGS. 6(a) and 7(a), however, the output signals D and D-bar (which is an inverted signal of the signal D) are not amplified up to the power source level (VDD) and the ground level (VSS). Therefore, it is necessary to provide another amplifier or further amplifiers in a subsequent stage. Further, since through current flows even after amplification, power-saving can hardly be achieved. If another circuit is provided in the subsequent stage, input level of this circuit is of medium electric potential. Therefore, through current flows at least in an input part of the amplifying circuit in the subsequent stage while the amplifying circuit is active. Thus, power-saving is more difficult to be achieved. Further, the sense-amplifying circuits shown in FIG. 6(a) and FIG. 7(a) each have a number of transistors and thus occupy large area on the chip. Considering the amplifying circuit in the subsequent stage, larger area on the chip is occupied by the two circuits.

A sense-amplifying circuit 80 shown in FIG. 7(b) does not have the above-cited disadvantages, but since output line (input/output lines 82 and 84) are bit lines with a heavy load, much time is needed for amplification. Further, since the sense-amplifying circuit 80 sends input and output signals via a common line, even when the circuit 80 is used for a SRAM or a read-only memory (hereinafter referred to as ROM) whose input signals may remain small, input signals are amplified extensively to power source level (VDD) and ground level (VSS). However, since an input line is a bit line which bears heavy capacitive load in most semiconductor memory devices, much power is wasted to charge and discharge the input line (input/output lines 82 and 84).

A sense amplifier capable of lowering power consumption by blocking a flow of through current is disclosed in the Japanese Patent Publication No. 2738306. The sense-amplifying amplifying circuit disclosed in the above publication comprises: a pair of CMOS inverters wherein input and output lines of each inverter are crossed; a power switch NMOS 7 placed between the pair of CMOS inverters and the ground, which is turned ON at the time of sensing; a pull-down nMOS 6 for equalizing each electric potential of output signals of inverters with the ground level before the start of sensing; and a pair of PMOS transistors (Y-selectors 4) connected to the sources of pMOS transistors making up said pair of CMOS inverters. The pair of PMOS transistors selects a pair of differential wires (a pair of bit lines 3), which is turned ON at the time of sensing and is charged up to power voltage level VDD by load PMOS 1.

In the above-cited sense-amplifying circuit, while Y-selectors 4 are turned OFF before the start of sensing operation and a pair of bit lines 3 is charged up to the supply-voltage-level VDD, a pair of data-lines 5 is equalized with the ground level by the pull-down nMOS 6. When the Y-selectors 4 are turned OFF, no through current flows. Then, when a certain potential difference is generated in said pair of bit lines 3, the power-switch 7 is turned ON, the pull-down nMOS 6 is turned OFF<and either of the above Y-selectors 4 is turned ON. Then, either of said pair of data lines 5 goes H-level to complete reading operation. After completing sensing operation, current is automatically shut off by a characteristic of the CMOS inverter. In consequence, power consumption can be lowered since through current does not flow.

However, in the above-cited sense-amplifying circuit, it is necessary that driving of the output signal of the sense amplifier to the H-level should be executed through the load MOS 1, the selector MOS (Y-selector) 4, and a pull-up device of the sense amplifier. Further, the sense amplifier initially outputs an L-level signal. Consequently, driving force to the H-level is rather weak, and if a pair of bit lines 3 is not precharged to powersource potential, amplification is retarded, and thus it causes a problem. Further, if the selectors MOS (Y-selectors) 4 are turned OFF after amplification, the sense amplifier is disengaged from the power source, and thus the output signal is not retained by a static circuit, but it is retained by a dynamic latch circuit. Therefore, it is quite impossible to preserve data for a long period of time. Even when data is to be preserved for a short period of time, it is possible that the output signal is inverted by lead current and noise.

SUMMARY OF THE INVENTION

To remove the above disadvantages, we have eventually found the present invention. An object of the present invention is to provide a small-sized sense amplifier, which is characterized by high-speed operation, minimum power consumption, and capability to amplify input signals rail-to-rail in a single stage.

An essential part of the present invention is to a sense-amplifying circuit comprises:

a pair of inverters wherein an output of each inverter is connected to an input of the other inverter; and sensing transistors whose drains are respectively connected to the sources of the pair of inverters, whose gates are connected to the sources of the pair of inverters, whose gates are connected to differential input signal lines, and whose sources are mutually connected as a common node.

BRIEF DESCRIPTION OF THE DRAWINGS

A better understanding of the invention will be obtained by reference to the detailed description below, in conjunction with the following drawings, in which.

PREFERRED EMBODIMENT OF THE INVENTION

Figure 1:
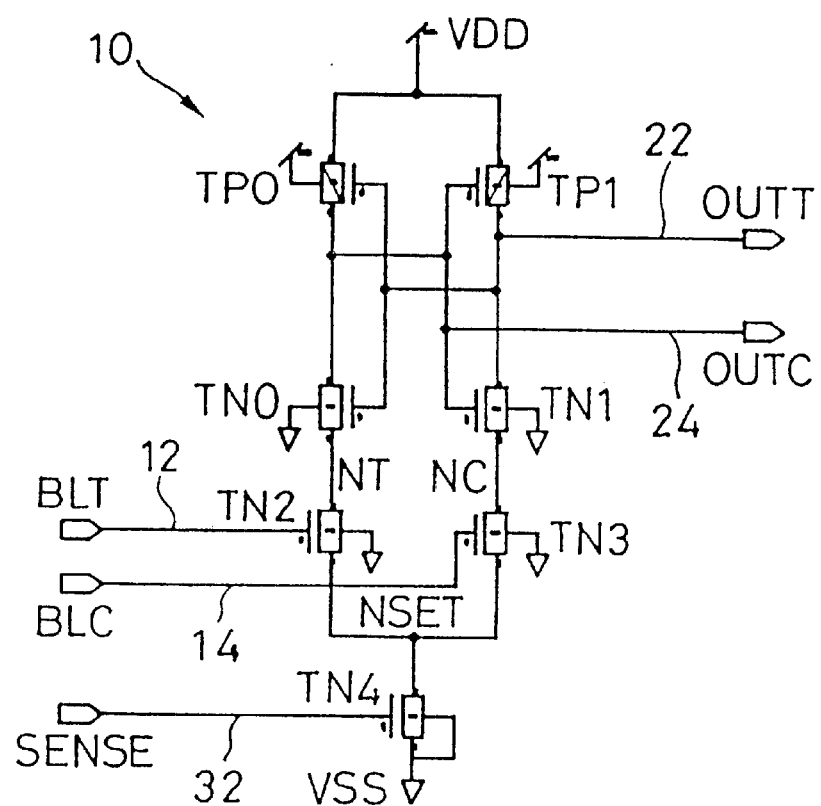
FIG. 1 illustrates a basic sense-amplifying circuit of the present invention.

Referring now to the accompanying drawings, embodiments of the sense-amplifying circuit of the present invention are described below by taking a sense-amplifying circuit using CMOS as an example. In the drawings, TPn wherein n represents an integer of 0 or more and TNn wherein n represents an integer of 0 or more indicate a pMOS transistor and a nMOS transistor, respectively.

FIG. 1 illustrates a basic sense-amplifying circuit 10 according to the present invention. The basic sense-amplifying circuit 10 comprises an inverter pair (including transistors TP0, TN0, TP1 and TN1), in which the input of each inverter is connected to the output of the other. The sources of these inverters are connected to the drains of sensing transistors TN2 and TN3, respectively. The gates of the sensing transistors TN2 and TN3 are connected to differential input signal lines 12 and 14, respectively. The sources of the sensing transistors TN2 and TN3 are ,connected through a common node with a transistor TN4, which works not only as a constant current source but also as an operation switch for the sense-amplifying circuit.

In a pair of inverters, an output of each inverter is connected to an input of the other inverter. Concretely, the output (the output signal line 24) of the inverter consisting of TP0 and TN0 is connected to the input of the other inverter consisting of TP1 andTN1. The sources of pMOS transistors of the inverters (TP0 and TP1) are connected to power supply node VDD through the common node. The drains of sensing transistors TN2 and TN3 are connected to the sources of nMOSs TN0 and TN1 of the inverters, respectively.

Differential input lines 12 and 14 are connected to a pair of sensing transistors TN2 and TN3, respectively. Concretely, the differential input signal line 12 is connected to the gate of the sensing transistor TN2, whereas the differential input signal line 14 is connected to the gate of the sensing transistor TN3. The transistor TN4 working as the constant current source as well as an operating switch of the sense amplifier is connected between the sources of the sensing transistors TN2 and TN3 and the ground VSS. Further, a signal line for activating the sense-amplifying circuit or a bias signal line 32 is connected to the gate of the transistor TN4 working as the constant current source. The above-referred pairs of transistors TN0 and TN1, TN2 andTN3, and TP0 and TP1 each are of the same size and the same physical characteristics. (TN0 and TN1 are of the same size and of the same characteristics, TN2 and TN3 are of the same size and of the same characteristics, and so on.)

Figure 2:
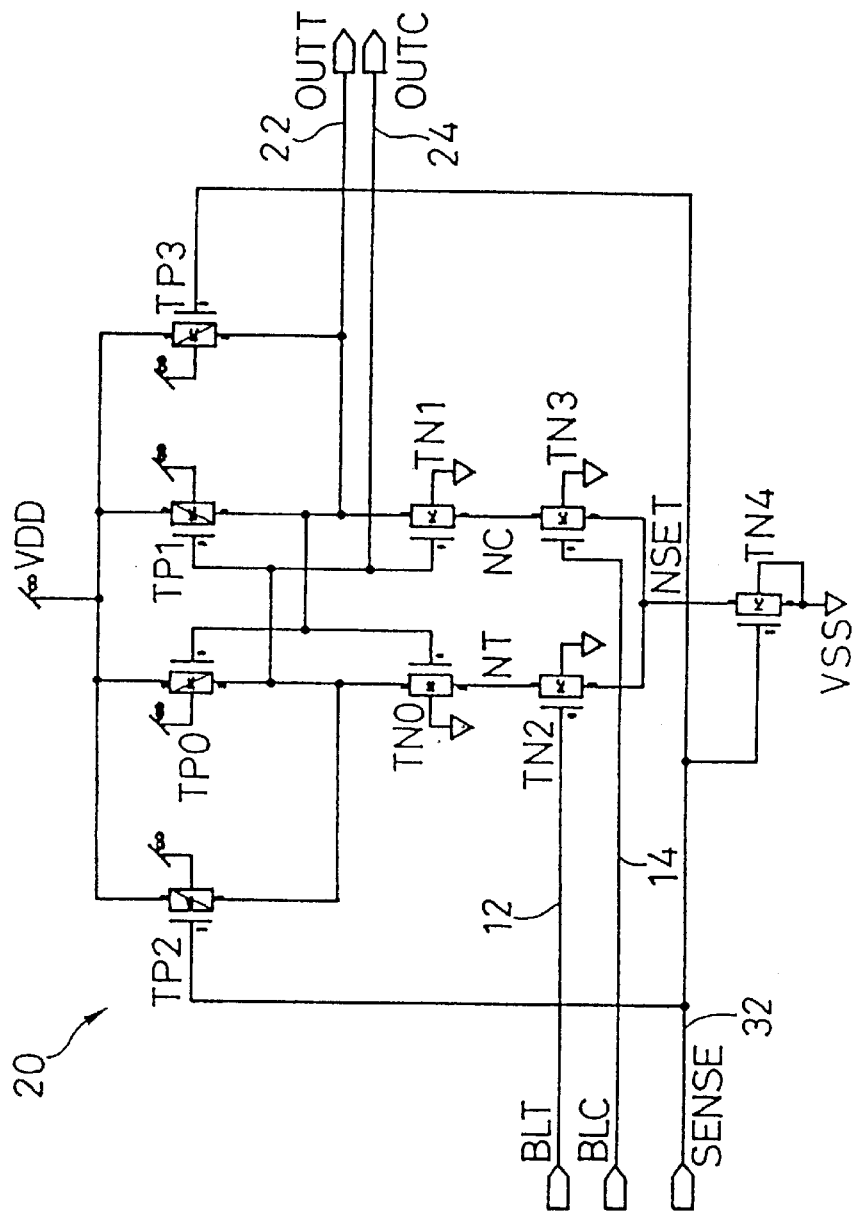
FIG. 2 is a circuit diagram of one form of the sense-amplifying circuit embodying the present invention.

FIG. 2 illustrates a basic sense-amplifying circuit 20 according to the present invention, wherein precharging devices TP2 and TP3 are added to the basic sense-amplifying circuit 10 shown in FIG. 1. The added precharging devices TP2 and TP3 each are connected between the power source VDD and the output signal lines 22 and 24. Concretely, the device TP2 is connected to the output signal line 24, whereas the device TP3 is connected to the output signal line 22. Signal lines 32 for activating the sense-amplifying circuit are connected to the gates of the precharging devices TP2 and TP3. Therefore, activations of the sense-amplifying device and the precharging device can be controlled by mutually opposite phases of the same signal (SENSE).

Next, the amplification of differential input signals BLT and BLC by operating the sense-amplifying circuit 20 is described below.

In the standby mode, the signal line 32 for activating a sense-amplifying circuit is in the condition of L-level, which is an electric potential to turn OFF the switching transistor TN4 working as the constant current supply. Since the signal line 32 for activating a sense-amplifying circuit is in the L-level, output signal lines 22 and 24 are precharged to H-level and their potentials are equalized. When the differential input signals BLT and BLC appear in the differential input signal lines 12 and 14, electric potential of the signal line 32 for activating a sense-amplifying circuit is raised to H-level and the TN4 is turned ON.

Assuming that electric potential of the differential input signal BLT is higher than that of the differential input signal BLC, the difference of the electric potential appears as the difference of driving force between the sensing transistors TN2 and TN3. Since the transistors TN2 and TN3 use the common source, electric potential of node NT is lower than that of node NC. The node NT corresponds to a node between the source of TN0 of a pair of inverters and the drain of the sensing transistor TN2, and the node NC corresponds to a node between the source of TN1 of a pair of inverters and the drain of the sensing transistor TN3. Under this condition, since the gates of the TN0 and TN1 of the pair of inverters are precharged to H-level, TN0 and TN1 are turned ON when the electric potentials of the nodes NT and NC are lowered to a certain degree and the electric potential difference that is inverse from the electric potential difference between the nodes NT and NC is generated between the output signal lines 22 and 24.

Also, as the potential at the node NSET is decreased, a potential difference between the output signal lines 22 and 24 is amplified through positive feedback owing to the circularly connected pair of inverters consisting of the transistors TN0, TP0, TN1 and TP1. Here, the node NSET is to the node between the sources of the sensing transistors TN2 and TN3 and the drain of the transistor TN4 working as the constant current source. During this amplification, the potential difference between the differential input signals BLT and BLC also make contribution to the amplification through the difference in the driving force between the sensing transistors TN2 and TN3. In other words, the sensing transistors TN2 and TN3 function also as an amplifier. When the amplification is ultimately completed, the output OUTT of the output signal line 22 is at the power source level (VDD) and the output OUTC of the output signal line 24 reaches the ground level (VSS), resulting in the CMOS output levels. Accordingly, no through current flows in the circuit at this point. Since the sense-amplifying circuit 20 has the configuration symmetrical about the differential input signal lines 12 and 14, in the case where the polarity of the input potential difference is reverse, namely, when the differential input signal BLC has a higher potential than the differential input signal BLT, the output OUTC is at the power source level (VDD) and the output OUTT becomes the ground level (VSS) ultimately, with the respective nodes going through the potentials which are reverse to those described above.

After completing the above amplification, as long as the sensing transistors TN2 and TN3 and the transistor TN4 working as the constant current supply are in the condition of ON, the pair of inverter circuits comprising transistors TN0, TP0, TN1, and TP1 functions as a static latch to retain the amplified output signal, even after input signals on the differential input signal lines 12 and 14 are lost.

Figure 6:
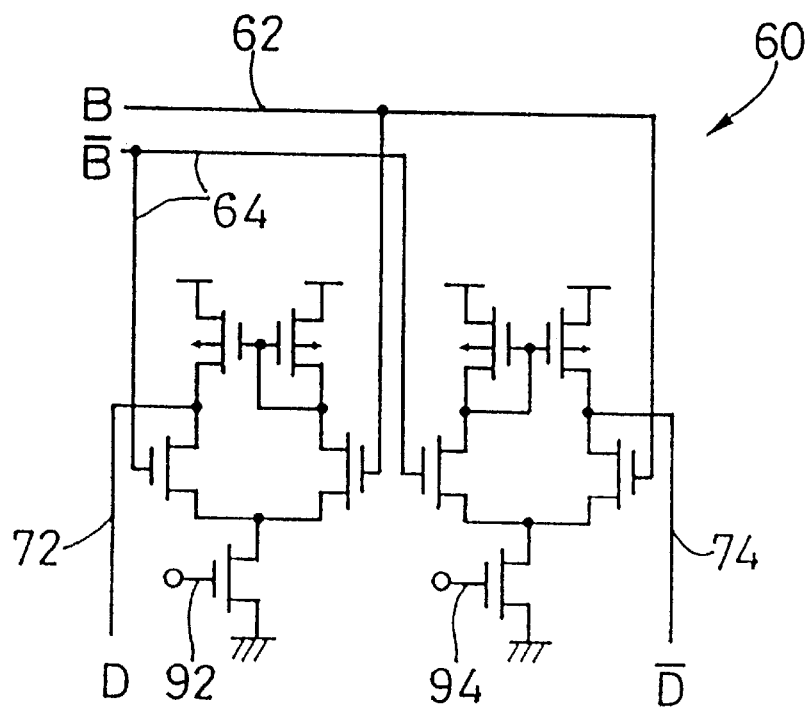
FIG. 6 is a circuit-diagram of one form of a conventional sense-amplifying circuit.
Figure 6:
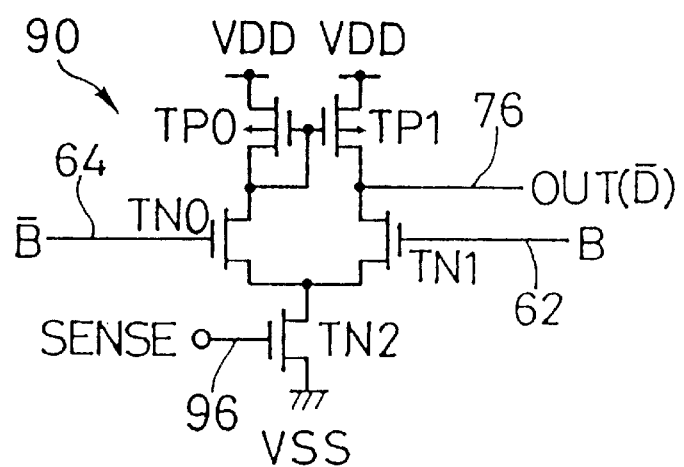
Figure 7:
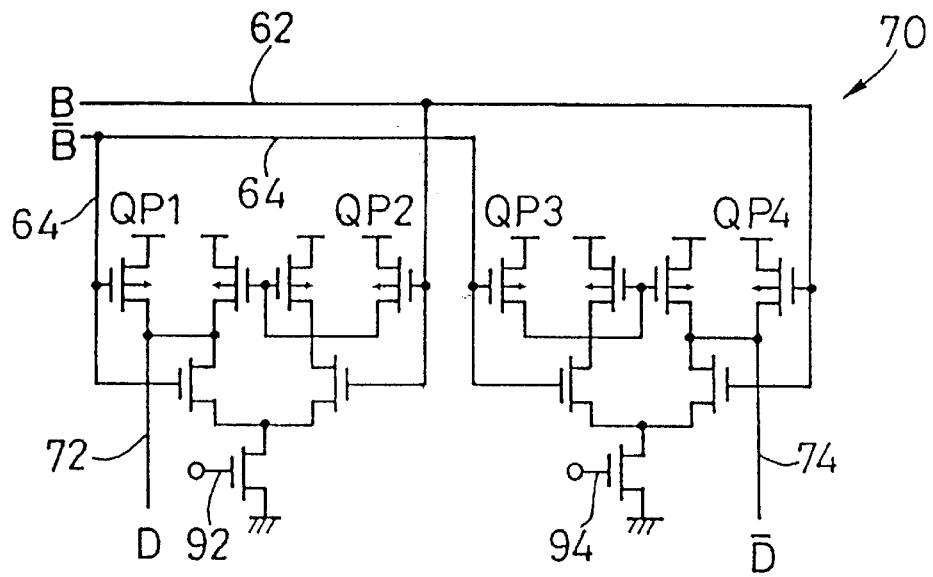
FIG. 7 is a circuit diagram of another form of a conventional sense-amplifying circuit.
Figure 7:
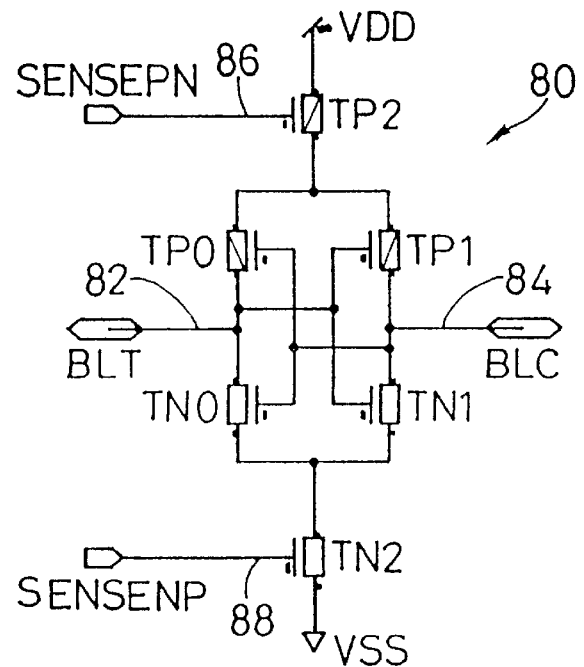

As described above, the slight difference of electric potential can be amplified at an extremely high speed by providing amplifying function not only to a pair of inverters consisting of TP0, TN0, TP1, and TN1, but also to the sensing transistors TN2 and TN3. Further, the sense-amplifying circuit 20 is capable of amplifying input signals up to power-source level VDD and ground-level VSS. Therefore, there is no need to add any other amplifiers. Compared to the conventional type of amplifying circuits 60 and 70 comprising current-mirror load shown in FIG. 6(a) and FIG. 7(a), the above sense-amplifying circuit 20 has fewer transistors, and yet, no additional amplifier is needed. Therefore, much smaller area is occupied by the transistors and thus the size of circuit becomes smaller. Further, since no through current flows, power consumption of the circuit can be decreased. And yet, since the output signal is on the CMOS level, power consumption of the whole sensing system can be reduced.

After completing the amplification, as long as the sensing transistors TN2 and TN3 and the transistor TN4 working as the constant current supply are in the condition of ON, the output signal amplified by the sense amplifier is retained by a static latching function of the same sense amplifier. Therefore, the differential input signal lines 12 and 14 can be precharged to the standby mode without retaining input signals. Accordingly, a system, such as a memory system, using this sense-amplifying circuit can be more easily designed owing to increased flexibility in timing design. In addition, the performance of the system can be improved because the cycle time thereof can be shortened.

There are no restrictions on absolute potential of input signals BLT and BLC, if sensing transistors TN2 and TN3 are in the condition of ON during the amplifying operation. However, higher potential generates better amplifying efficiency.

Figure 3:
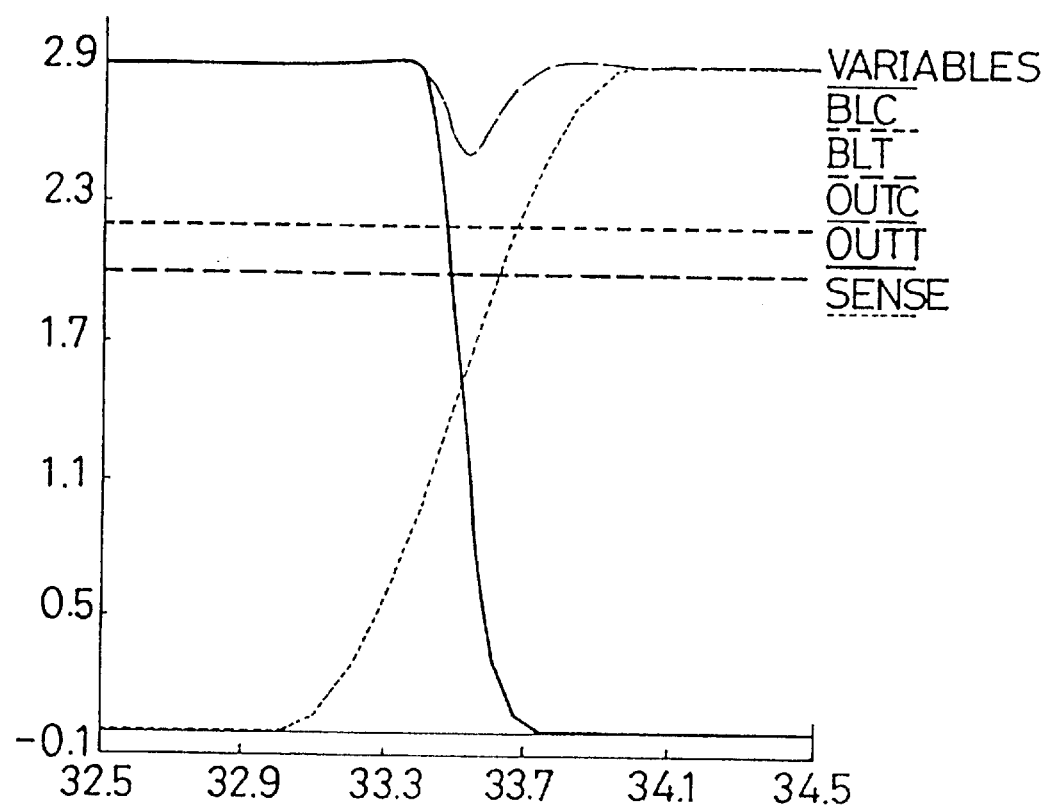
FIG. 3 is a simulation wave form chart of output and input of the sense-amplifying circuit according to FIG. 2.

FIG. 3 shows the result of simulation obtained by using a circuit simulator. The sensing speed depends upon the size of the transistor TN4 working as the constant current source. In the case where the transistor TN4 has substantially the same size as the sensing transistors TN2 and TN3, when a 0.3-$\mu$m process and a supply voltage of 2.9V are adopted, the amplification is completed in approximately 0.2 ns. At a temperature of 125° C. It has been confirmed by using the circuit simulator that the magnitude of an input signal scarcely affects the time required for the amplification, and that, in using an ideal device, a small signal of approximately 10 mV can be amplified in substantially the same time period. Since a potential difference of approximately 100 mV is required to be practically amplified in actual use, the amplifying performance of this circuit is sufficiently high even in consideration of mismatch in the threshold voltage of transistors and the like. This amplifying performance is sufficiently usable even in a high-speed SRAM, and the present amplifying circuit in merely one stage can provide sufficient amplification in an SRAM with a small capacity. When this circuit is used as a sense latch circuit at the final stage in a large capacity SRAM generally with a large data line load, a high speed operation can be realized with small power consumption with the voltage amplitude of the data line suppressed. This circuit is used in a CAM (content addressable memory) macro with CAM cells which have comparing circuits in addition to SRAM cells, and high performance of an access time of 9 ns. And a cycle time of 10 ns. Can be realized even under the worst conditions including the operation condition and the manufacturing condition with a 0.3-$\mu$m process.

Figure 4:
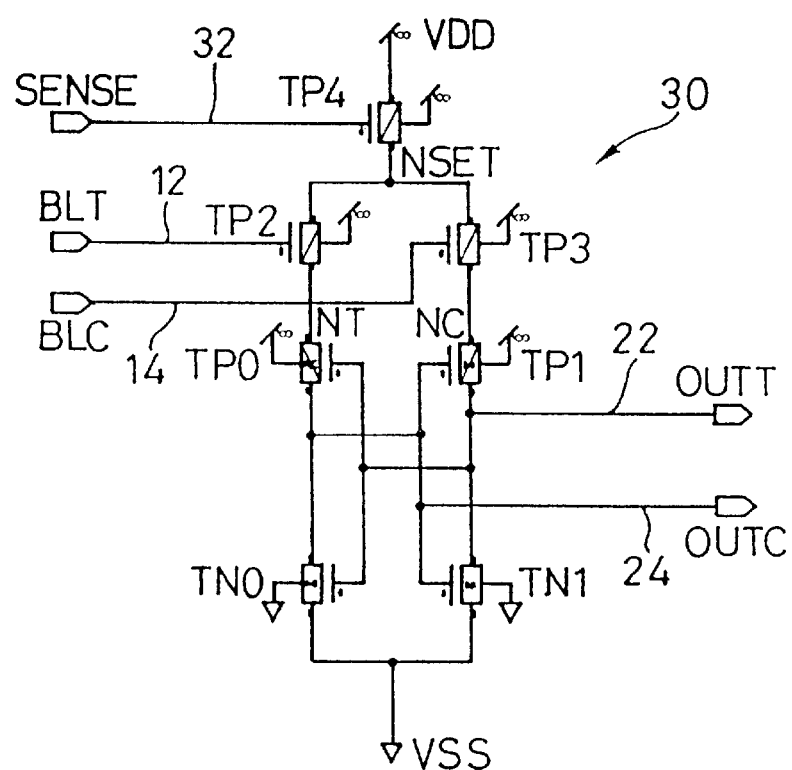
FIG. 4 is a circuit diagram of another form of the sense-amplifying circuit embodying the present invention.

Having described a practical embodiment of the present invention, it should be understood that the sense-amplifying circuit according to the present invention can also be materialized in other practical forms. For example, if one of the output signals OUTT and OUTC from the sense-amplifying circuit is of H-level, the other output signal should be of L-level. Therefore, it is possible to provide only one output signal line. Alternatively, in the case where CMOS circuits are used as is shown in FIG. 1, nMOS transistors and PMOS transistors are mutually exchangeable, so as to obtain a sense-amplifying circuit 30 as is shown in FIG. 4. In this sense-amplifying circuit 30, drains of sensing transistors TP2 and TP3 are connected respectively with the sources of TP0 and TP1 of a pair of inverters TP0, TN0, TP1, and TN1. Further, in the sense-amplifying circuit 30, a polarity of SENSE, that is, signal for activating sense-amplifying circuit, is inverse from that in the sense-amplifying circuit 10 shown in FIG. 1.

Figure 5:
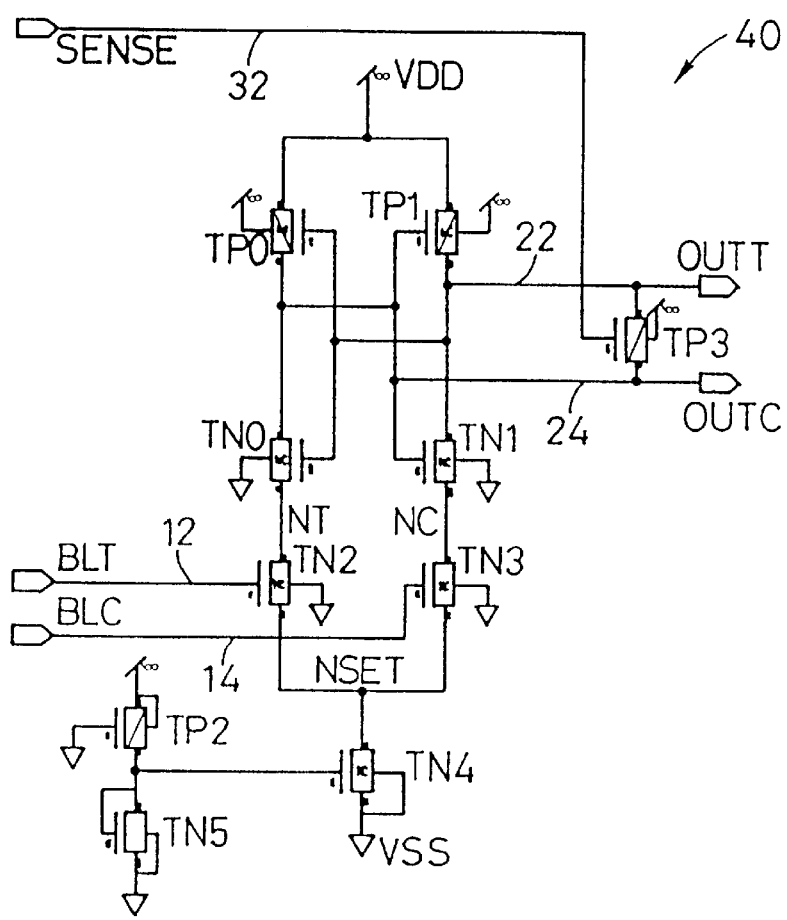
FIG. 5 is a circuit diagram of still another form of the sense-amplifying circuit embodying the present invention.

Based on the drawings, preferred embodimnts of the present invention have been described above, but the present invention is not limited to the sense-amplifying circuits shown by the drawings. For example, as shown in FIG. 5, the sense-amplifying circuit of the present invention may also have an equalizing means (transistor TP3), or transistor TN4 can be used as a static constant-current power supply. In the sense-amplifying circuit 40, differential input signal lines 12 and 14 are precharged to threshold voltage or less of the sensing Resistors TN2 and TN3 and then equalized. In the standby mode, the SENSE is of L-level, and the transistor TP3 (equalizing means) equalized output signal lines 22 and 24. When the SENSE is turned into H-level level after differential signals appear in the differential input signal lines 12 and 14, the input is amplified to the CMOS levels, and then, the result is latche Having now fully described the invention, it will be apparent to those skilled in the art that various changes, improvements and modifications can be made thereto without departing from the spirit or scope of the present invention.

According to the sense-amplifying circuit of the present invention, even the slightest potential difference can be amplified at an extremely high speed. Input signal can be amplified to generate the outputs whose high level is power source potential and whose low level is ground potential by using only one stage of circuit. Further, after completing amplification, flow of through current is automatically stopped. For this reason, power consumption of the circuit is extremely small. And yet, since output signal is of CMOS levels, there is no need to provide additional amplifiers in a subsequent stage. Thus, power consumption of the whole sensing system can be reduced. Moreover, the circuit itself is small. Therefore, it is possible to provide a sense amplifier which occupies small area on the chi and can amplify the input in a single stage at a high speed with small power consumption. Further, the sense amplifier itself has static-latch function, which is an excellent function to retain output signal even when the input signal are changed. Therefore, immediately after latching, input signals can be precharged. Accordingly, a system such as memory system can be more easily designed owing to increased flexibility in timing design. In addition, the performance of the system can be improved because the cycle time thereof can be shortened.

A person understanding this invention may now conceive of alternative structures and embodiments or variations of the above. All of those which fall within the scope of the claims appended hereto are considered to be part of the present invention.

What is claimed is:

1. A sense-amplifying circuit comprising:
    a pair of inverters, an input of each inverter in the pair of inverters being connected to an output of the other inverter, and
    sensing transistors, each drain being respectively connected to sources of the pair of inverters, each gate being connected to differential input signal lines, and each source being mutually connected as a common node to a static constant current source, wherein the differential input signal lines are precharged to a voltage level equal to about a threshold voltage of the respective sensing transistors in a precharge period.

2. The sense-amplifying circuit according to claim 1, further comprising precharging means for precharging outputs of the pair of inverters.

3. The sense-amplifying circuit according to claim 2, further comprising equalizing means for equalizing output potentials of the pair of inverters.

4. The sense-amplifying circuit according to claim 3, wherein said equalizing means is connected to a sense enable signal.

5. The sense-amplifying circuit according to claim 4 therein said equalizing means comprises a transistor.

6. The sense-amplifying circuit according to claim 5, wherein said transistor is an MOS transistor.

7. The sense-armplifying circuit according to claim 6, wherein said MOS transistor has a gate connected to said sense enable signal, a source connected to a first output of said pair of output potentials, and a drain connected to a second output of said pair of output potentials.

8. The sense-amplifying circuit according to claim 1, wherein a gate of the constant current source is connected to the constant bias generator.

9. The sense-armplifying circuit according to claim 1, wherein the voltage level is below the threshold voltage of the respective sensing transistors.

10. The sense-amplifying circuit according to claim 1, wherein the static constant current source is biased by a constant bias generator.

* * * * *